United States Patent
Choi et al.

(10) Patent No.: US 9,915,261 B2
(45) Date of Patent: Mar. 13, 2018

(54) SUBSTRATE TREATING APPARATUS, DRIVE ASSEMBLY, AND DRIVE MEMBER CONTROLLING METHOD

(71) Applicant: Semes Co., Ltd., Cheonan-si, Chungcheongnam-do (KR)

(72) Inventors: Jin Ho Choi, Cheonan-si (KR); Ju Mi Yoo, Cheonan-si (KR)

(73) Assignee: Semes Co., Ltd., Chungcheongnam-Do (KR)

( * ) Notice: Subject to any disclaimer, the term of this patent is extended or adjusted under 35 U.S.C. 154(b) by 359 days.

(21) Appl. No.: 14/527,936

(22) Filed: Oct. 30, 2014

(65) Prior Publication Data

US 2015/0117987 A1 Apr. 30, 2015

(30) Foreign Application Priority Data

Oct. 31, 2013 (KR) .................. 10-2013-0131357
Dec. 27, 2013 (KR) .................. 10-2013-0165403

(51) Int. Cl.

| F16D 31/02 | (2006.01) |
|---|---|
| F04B 49/20 | (2006.01) |
| H01L 21/67 | (2006.01) |
| F04B 49/06 | (2006.01) |
| F04B 49/10 | (2006.01) |
| H01L 21/677 | (2006.01) |

(52) U.S. Cl.
CPC ............ F04B 49/20 (2013.01); F04B 49/06 (2013.01); F04B 49/103 (2013.01); H01L 21/67259 (2013.01); H01L 21/67742 (2013.01); F04B 2201/0201 (2013.01); F04B 2201/0202 (2013.01)

(58) Field of Classification Search
CPC ..... F15B 11/04; F15B 11/042; F15B 11/0423; F15B 15/2815; H01L 21/67259; H01L 21/67742
See application file for complete search history.

(56) References Cited

U.S. PATENT DOCUMENTS 5,977,778 A * 11/1999 Chan ................... F15B 15/2815
                                                              91/361
7,213,502 B2 * 5/2007 Vonderwell ........... F15B 11/006
                                                              60/461

(Continued)

FOREIGN PATENT DOCUMENTS

| CN | 203118916 U | 8/2013 |
|---|---|---|
| JP | 2000-018207 A | 1/2000 |

(Continued)

*Primary Examiner* — Michael Leslie
(74) *Attorney, Agent, or Firm* — Harness, Dickey & Pierce, P.L.C.

(57) ABSTRACT

Provided is a substrate treating apparatus. The substrate treating apparatus includes: a transfer chamber conveying a substrate; a process chamber disposed adjacent to the transfer chamber and performing a treating process o the substrate; and a drive assembly supplying a power by which a component of the transfer chamber or the process chamber operates, wherein the drive assembly includes: a cylinder connected to pipes; a piston disposed to be movable inside the cylinder and connected to the component by a drive shaft; and a pipe control unit automatically adjusting a moving speed of the piston.

21 Claims, 6 Drawing Sheets

(56) References Cited

U.S. PATENT DOCUMENTS

| | | | |
|---|---|---|---|
| 8,007,218 B2* | 8/2011 | Park | ................ H01L 21/67742 414/217 |
| 2007/0051314 A1* | 3/2007 | Choi | ................ H01L 21/67196 118/719 |
| 2013/0145926 A1* | 6/2013 | Koeckemann | ...... F15B 11/0426 91/363 R |

FOREIGN PATENT DOCUMENTS

| KR | 20060032280 A | 4/2006 |
|---|---|---|
| KR | 20130100789 A | 9/2013 |
| WO | WO-2012072590 A1 | 6/2012 |

\* cited by examiner

SUBSTRATE TREATING APPARATUS, DRIVE ASSEMBLY, AND DRIVE MEMBER CONTROLLING METHOD

CROSS-REFERENCE TO RELATED APPLICATIONS

This U.S. non-provisional patent application claims priority under 35 U.S.C. § 119 of Korean Patent Application Nos. 10-2013-0131357, filed on Oct. 31, 2013, and 10-2013-0165403, filed on Dec. 27, 2013, the entire contents of which are hereby incorporated by reference.

BACKGROUND OF THE INVENTION

The present invention disclosed herein relates to a substrate treating apparatus, a drive assembly, and a drive member controlling method.

The various processes such as cleaning, deposition, photolithography, etching, and ion implantation are performed to fabricate semiconductor devices. Each of the above processes may be performed in process chambers having different configurations. Then, a substrate may be transferred between process chambers by a robot or a transfer chamber including a rail.

Drive components of such a process chamber or a transfer chamber may be operated by a drive member providing power. Such a drive member may have cylinder and piston structures.

SUMMARY OF THE INVENTION

The present invention provides a substrate treating apparatus automatically adjusting the speed of a piston, a drive assembly, and a drive member controlling method.

Embodiments of the present invention provide substrate treating apparatus including: a transfer chamber conveying a substrate; a process chamber disposed adjacent to the transfer chamber and performing a treating process o the substrate; and a drive assembly supplying a power by which a component of the transfer chamber or the process chamber operates, wherein the drive assembly includes: a cylinder connected to pipes; a piston disposed to be movable inside the cylinder and connected to the component by a drive shaft; and a pipe control unit automatically adjusting a moving speed of the piston.

In some embodiments, the pipes may include: a first pipe connected to an upper portion of the cylinder; and a second pipe connected to a lower portion of the cylinder, wherein the pipe control unit may be provided to receive a signal of sensors disposed at the cylinder.

In other embodiments, the pipe control unit may include: a pipe control module controlling a fluid flowing through the pipes; and a module control part adjusting an operation of the pipe control module on the basis of a signal of the sensors.

In still other embodiments, the sensors may include: a first sensor disposed at an upper portion of the cylinder; and a second sensor disposed at a lower portion of the cylinder.

In even other embodiments, the module control part may detect a moving speed of the piston through a change of a signal transmitted from the first sensor and the second sensor.

In yet other embodiments, the module control part may compare the moving speed and a setting speed of the piston and when the moving speed is out of an error range in relation to the setting speed, may perform an adjustment on the pipe control module.

In further embodiments, when the moving speed is slower than the setting speed, the module control part may adjust the pipe control module to increase a flow rate of a fluid flowing through the first pipe or the second pipe.

In still further embodiments, when the moving speed is slower than the setting speed, the module control part may adjust the pipe control module to increase a pressure of a fluid flowing through the first pipe or the second pipe.

In even further embodiments, when the moving speed is faster than the setting speed, the module control part may adjust the pipe control module to decrease a flow rate of a fluid flowing through the first pipe or the second pipe.

In yet further embodiments, when the moving speed is faster than the setting speed, the module control part may adjust the pipe control module to decrease a pressure of a fluid flowing through the first pipe or the second pipe.

In yet further embodiments, the pipe control unit may include a piezo actuator.

In other embodiments of the present invention, drive assemblies include: a cylinder connected to pipes; a piston disposed to be movable inside the cylinder and having one side where a drive shaft is provided; and a pipe control unit automatically adjusting a moving speed of the piston.

In some embodiments, the pipes may include: a first pipe connected to an upper portion of the cylinder; and a second pipe connected to a lower portion of the cylinder, wherein the pipe control unit is provided to receive a signal of a first sensor disposed at an upper portion of the cylinder and a second sensor disposed at a lower portion of the cylinder.

In other embodiments, the pipe control unit may include: a pipe control module controlling a fluid flowing through the pipes; and a module control part adjusting an operation of the pipe control module on the basis of signals of the first sensor and the second sensor.

In still other embodiments, the module control part may detect a moving speed of the piston through a change of a signal transmitted from the first sensor and the second sensor.

In even other embodiments, the module control part may compare the moving speed and a setting speed of the piston and when the moving speed is out of an error range in relation to the setting speed, may perform an adjustment on the pipe control module.

In still other embodiments of the present invention, provided are methods of controlling a drive member. The method include: detecting a moving speed of a piston moving inside a cylinder; when it is determined that the moving speed of the piston is out of an error range in relation to a setting speed, automatically adjusting a flow of a fluid supplied to the cylinder when the piston is driven next time.

In some embodiments, the methods may increasing an amount of a fluid supplied to the cylinder when the moving speed of the piston is slower than the setting speed.

In other embodiments, the methods may increasing a fluid pressure of a fluid supplied to the cylinder when the moving speed of the piston is slower than the setting speed.

In still other embodiments, the methods may decreasing an amount of a fluid supplied to the cylinder when the moving speed of the piston is faster than the setting speed.

In even other embodiments, the methods may decreasing a fluid pressure of a fluid supplied to the cylinder when the moving speed of the piston is faster than the setting speed.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
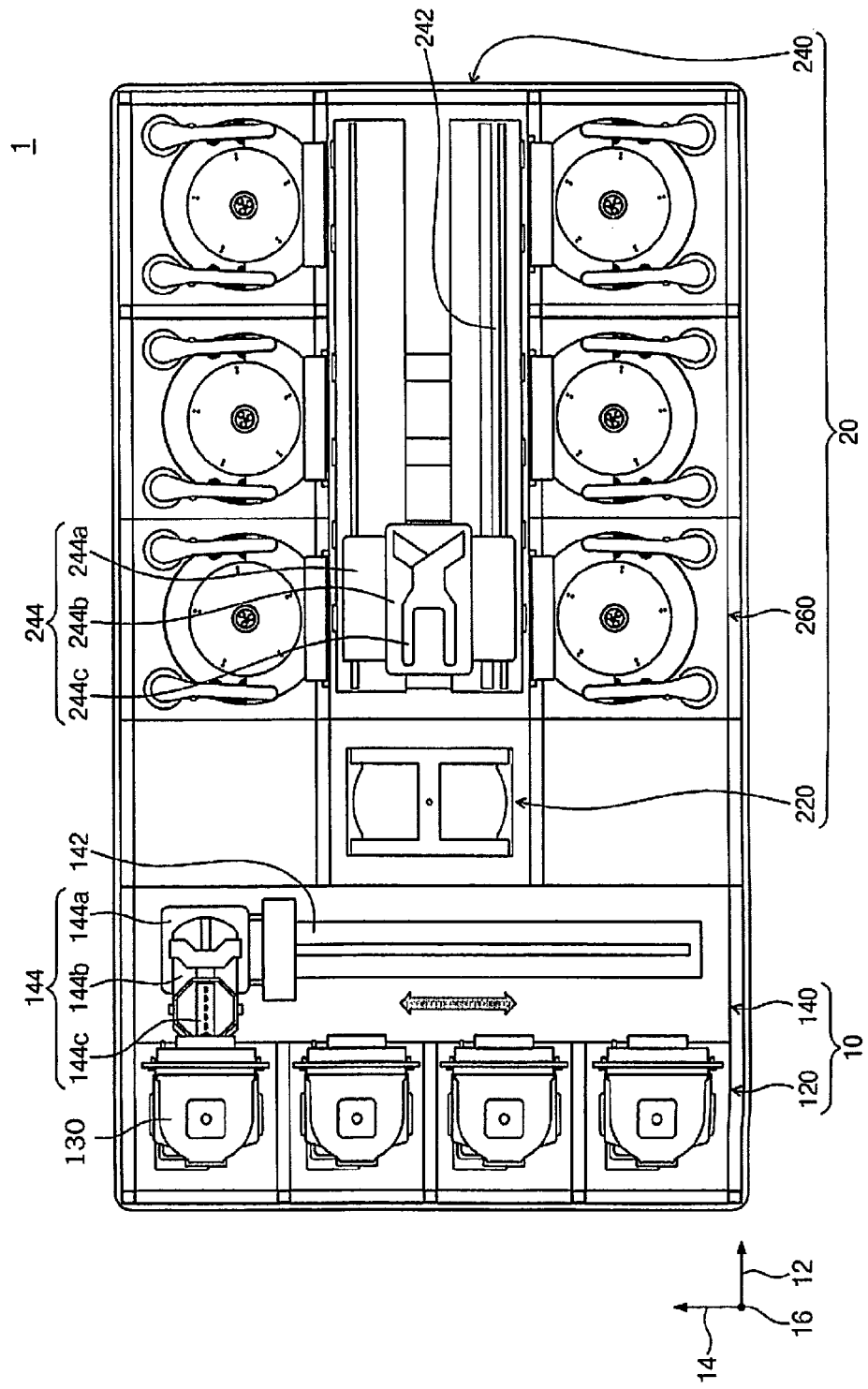
FIG. 1 is a plan view of a substrate treating apparatus according to an embodiment of the present invention.

Hereinafter, preferred embodiments are described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the drawings, the dimensions of layers and regions are exaggerated for clarity of illustration.

FIG. 1 is a plan view of a substrate treating apparatus according to an embodiment of the present invention.

Referring to FIG. 1, the substrate treating apparatus 1 has includes an index module 10 and a process treating module 20. The index module 10 includes a load port 120 and a transfer frame 140. The load port 120, the transfer frame 140, and the process treating module 20 are arranged in a line sequentially. Hereinafter, a direction in which the load port 120, the transfer frame 140, and the process treating module 20 are arranged is referred to as a first direction 12. As seen from the top, a direction vertical to the first direction 12 is referred to as a second direction 14. A direction vertical to a plane including the first direction 12 and the second direction 14 is referred to as a third direction 16.

A carrier 130 accommodating a substrate W is disposed at the load port 140. The load port 120 is provided in plurality and they are disposed in a line along the second direction 14. The number of load ports 120 may be increased or decreased according to the process efficiency and footprint condition of the process treating module 20. A plurality of slots (not shown) for accommodating the substrates W to be disposed parallel to the ground are formed in the carrier 130. A front opening unified pod (FOUP) may be used as the carrier 130.

The process treating module 20 includes a buffer unit 220, a transfer chamber 240, and a process chamber 260. The length direction of the transfer chamber 240 is disposed parallel to the first direction 12. The process chambers 260 are disposed at each of the both sides of the transfer chamber 240. The process chambers 260 are provided to be symmetric relative to the transfer chamber 240 at the one side and the other side of the transfer chamber 240. The plurality of process chambers 260 are provided at one side of the transfer chamber 240. Some of the process chambers 260 are disposed along the length direction of the transfer chamber 240. Additionally, some of the process chambers 260 are disposed to be stacked each other. That is, the process chambers 260 are disposed in an arrangement of A×B at one side of the transfer chamber 240. Herein, A is the number of the process chambers 260 provided in a line along the first direction 12 and B is the number of the process chambers 260 provided in a line along the third direction 16. When four or six process chambers 260 are provided at one side of the transfer chamber 240, the process chambers 260 may be disposed in an arrangement of 2×2 or 3×2. The number of the process chambers 260 may be increased or decreased. Unlike that described above, the process chamber 260 may be provided at only one side of the transfer chamber 240. Additionally, the process chamber 260 may be provided as a single layer at one side or both sides of the transfer chamber 240.

The buffer unit 220 is disposed between the transfer frame 140 and the transfer chamber 240. The buffer unit 220 provides a space where the substrate W stays before the substrate W is conveyed between the transfer chamber 240 and the transfer frame 140. A slot (not shown) where the substrate W is disposed is provided inside the buffer unit 220. The slot (not shown) is provided in plurality to be spaced from each other along the third direction 16. In relation to the buffer unit 220, a side facing the transfer frame 140 and a side facing the transfer chamber 240 are opened.

The transfer frame 140 conveys the substrate W between the carrier 130 seated on the load port 120 and the buffer unit 220. An index rail 142 and an index robot 144 are provided to the transfer frame 140. The length direction of the index rail 142 is provided parallel to the second direction 14. The index robot 144 is installed on the index rail 142 and linearly moves in the second direction 14 along the index rail 142. The index robot 144 has a base 144 *a*, a body 144 *b*, and an index arm 144 *c*. The base 144 *a* is installed to be movable along the index rail 142. The body 144 *b* is coupled to the base 144 *a*. The body 144 *b* is provided to move along the third direction 16 on the base 144 *a*. Additionally, the body 144 *b* is provided to be rotatable on the base 144 *a*. The index arm 144 *c* is coupled to the body 144 *b* and is provided to be moved forward or backward against the body 144 *b*. The index arm 144 *c* is provided in plurality and is provided to be driven individually. The index arms 144 *c* are disposed to be stacked spaced apart from each other along the third direction 16. Some of the index arms 144 *c* may be used when the substrate W is conveyed from the process treating module 20 to the carrier 130 and the others may be used when the substrate W is conveyed from the carrier 130 to the process treating module 20. This may prevent particles generated from the substrate W before a process treatment when the index robot 144 loads and unloads the substrate W from being attached to the substrate W after a process treatment.

The transfer chamber 240 conveys the substrate between the buffer unit 220 and the process chamber 260 and between the process chambers 260. A guide rail 242 and a main robot 244 are provided to the transfer chamber 240. The length direction of the guide rail 242 is disposed parallel to the first direction 12. The main robot 244 is installed on the guide rail 242 and linearly moves along the first direction 12 on the guide rail 242. The main robot 244 has a base 244*a*, a body 244*b*, and a main arm 244*c*. The base 244*a* is installed to be movable along the guide rail 242. The body 244*b* is coupled to the base 244*a*. The body 244*b* is provided to be movable along the third direction 16 on the base 244*a*. Additionally, the body 244*b* is provided to be rotatable on the base 244*a*. The main arm 244*c* is coupled to the body 244*b* and is provided to be moved forward or backward against the body 244*b*. The main arm 244*c* is provided in plurality and is provided to be driven individually. The main arms 244c are disposed to be stacked spaced apart from each other along the third direction 16.

The process chamber 260 performs a treatment process on the substrate W. A process performed in the process chamber 260 may be a cleaning, deposition, photolithography, etching, or ion implantation process on a substrate.

Figure 2:
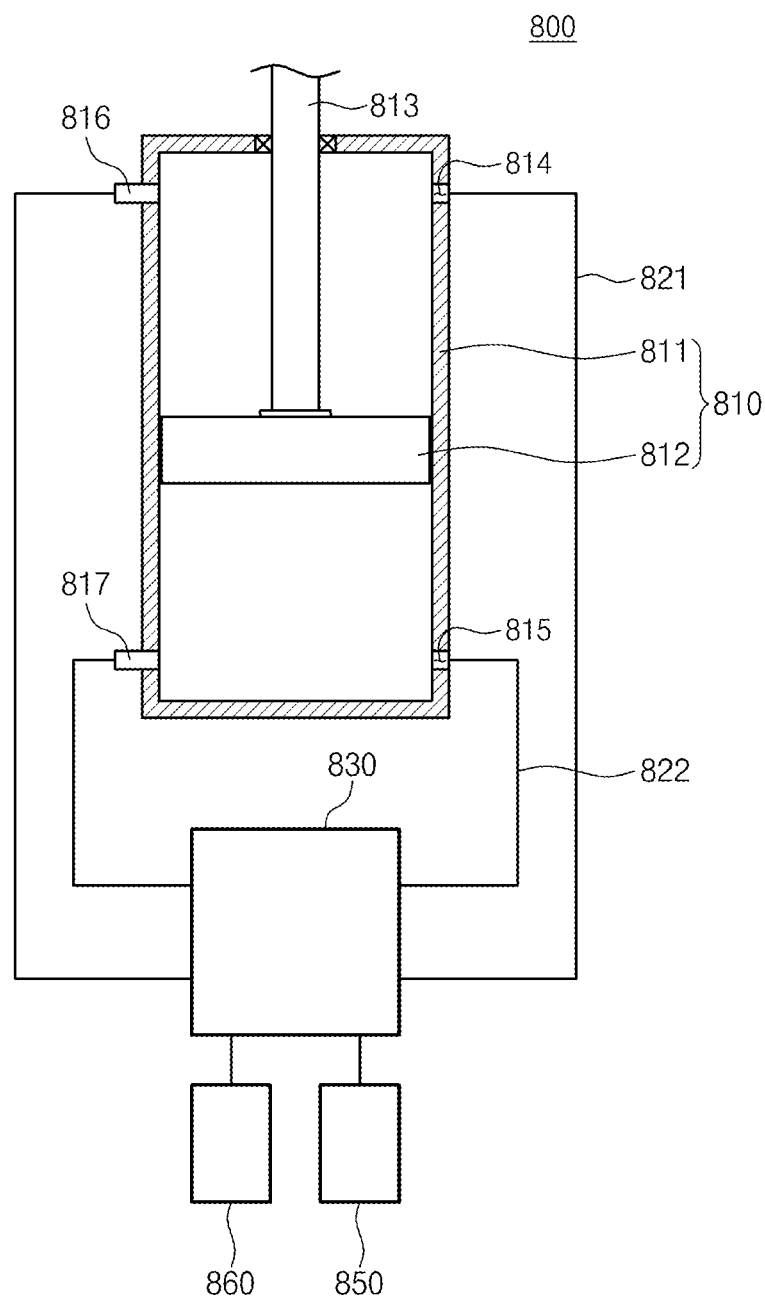
FIG. 2 is a view illustrating a drive assembly according to an embodiment of the present invention.

FIG. 2 is a view illustrating a drive assembly according to an embodiment of the present invention.

Referring to FIG. 2, the drive assembly 800 provides a power for an operation of one component of the substrate treating apparatus 1. The drive assembly 800 includes a drive member 810 and a pipe control unit 830.

The drive member 810 provides a power for an operation of one component of the substrate treating apparatus 1. For example, the drive member 810 is connected to the index robot 144 or the main robot 244, so that it may provide a power for driving the index robot 144 or the main robot 244. Additionally, the drive member 810 is provided to the buffer unit 220, the transfer chamber 240, or the process chamber 260, so that it provides a power for operations of the above units' components.

The drive member 810 includes a cylinder 811 and a piston 812. A space where the piston 812 reciprocates is formed inside the cylinder 811. A drive shaft 813 is connected to one side of the piston 812. The drive shaft 813 delivers a power generated from the movement of the piston 812 to components of the substrate treating apparatus 1. Hereinafter, one side of the drive shaft 813 connected to the outside in the cylinder 811 is referred to as the upper portion of the cylinder 811 and the opposite side is referred to as the lower portion of the cylinder 811.

A first hole 814 and a second hole 815 are formed in the cylinder 811. The first hole 814 is formed in an upper sidewall of the cylinder 811 and the second hole 815 is formed in a lower sidewall of the cylinder 811. The piston 812 may move between the first hole 814 and the second hole 815 by a gas supplied to the first hole 814 or the second hole 815.

Sensors 816 and 817 are provided to a side of the cylinder 811. The sensors 816 and 817 include a first sensor 816 positioned at the top of the cylinder 811 and a second sensor 817 positioned at the bottom of the cylinder 811. The first sensor 816 and the second sensor 817 may detect whether the piston 812 is disposed at the upper or lower portion of the cylinder 811.

The pipe control unit 830 is connected to the drive member 810 to adjust an operation of the drive member 810. In more detail, each of the first hole 814 and the second hole 815 is connected to the pipe control unit 830 through a first pipe 821 and a second pipe 822. Additionally, the pipe control unit 830 is connected to a fluid supply source 850. The fluid supply source 850 stores a fluid to be supplied to the first pipe 821 and the second pipe 822. The pipe control unit 830 may adjust the amount of fluid supplied to the cylinder 811 through the first hole 814 or discharged from the cylinder 811 through the first hole 814. Additionally, the pipe control unit 830 may adjust the amount of fluid supplied to the cylinder 811 through the second hole 815 or discharged from the cylinder 811 through the second hole 815.

The pipe control unit 830 receives a detected signal from the first sensor 816 and the second sensor 817. Additionally, the pipe control unit 830 may be connected to the control member 860. The control member 860 may store information relating to an operation of the drive member 810. For example, the control member 860 may store a setting speed when the piston 812 moves from the top of the cylinder 811 to the bottom or from the bottom of the cylinder 811 to the top. Additionally, the control member 860 may store information on a time interval between the operation end and the next operation start of the piston 812. A user may change the above information stored in the control member 860. The control member 860 is connected to the pile control unit 830 wirelessly or wiredly and provides information relating to an operation of the drive member 810 to the pipe control unit 830. Additionally, the control member 860 may store information on a control of each component of the substrate treating apparatus 1. Additionally, the control member 860 may control an operation of each component of the substrate treating apparatus 1 by using the above information. The pipe control unit 830 may adjust the amount of fluid supplied to the first pipe 821 or the second pipe 822 or discharged from the first pipe 821 or the second pipe 822 through information provided from the first sensor 816, the second sensor 817, and the control member 860.

Figure 3:
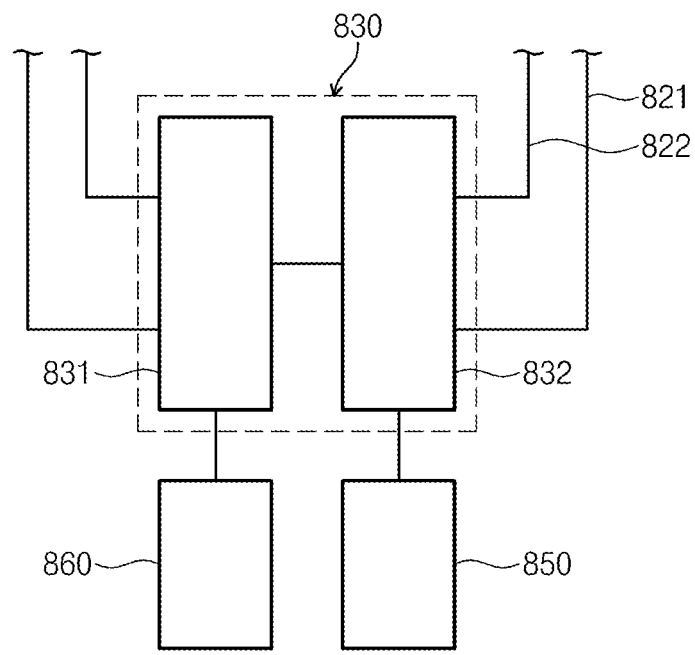
FIG. 3 is a view illustrating a pipe control unit.

FIG. 3 is a view illustrating a pipe control unit.

Referring to FIGS. 2 and 3, the pipe control unit 830 may detect the moving speed of the piston 812.

The pipe control unit 830 includes a module control part 831 and a pipe control module 832.

The module control part 831 is connected to the sensors 816 and 817 and the pipe control module 832. The module control part 831 controls the pipe control module 832 through a signal inputted from the sensors 816 and 817 and information provided from the control member 860. The module control part 831 may calculate the moving speed of the piston 812 through a signal inputted from the sensors 816 and 817. The piston 812 may move from one lower position of the cylinder 811 to one upper position thereof. Additionally, the piston 812 may move from one upper position of the cylinder 811 to one lower position thereof. Each of the first sensor 816 and the second sensor 817 transmits different information to the module control part 831 according to whether the piston 812 is positioned at the upper or lower portion of the cylinder 811. For example, when it is detected that the piston 812 is positioned at the upper or lower portion of the cylinder 811, each of the first sensor 816 and the second sensor 817 may transmit a setting signal to the module control part 831. Then, as the piston 812 moves and is not positioned at the upper and lower portions, each of the first sensor 816 and the second sensor 817 may not transmit a signal. Accordingly, when the piston 812 moves from the lower portion of the cylinder 811 to the upper portion thereof, first, a signal transmitted from the second sensor 817 changes and then, a signal transmitted from the first sensor 816 changes. Moreover, when the piston 812 moves from the upper portion of the cylinder 811 to the lower portion thereof, first, a signal transmitted from the first sensor 816 changes and then, a signal transmitted from the second sensor 817 changes. The module control part 831 may calculate the moving speed of the piston 812 through a time difference between the signals transmitted from the sensors 816 and 817.

Figure 4:
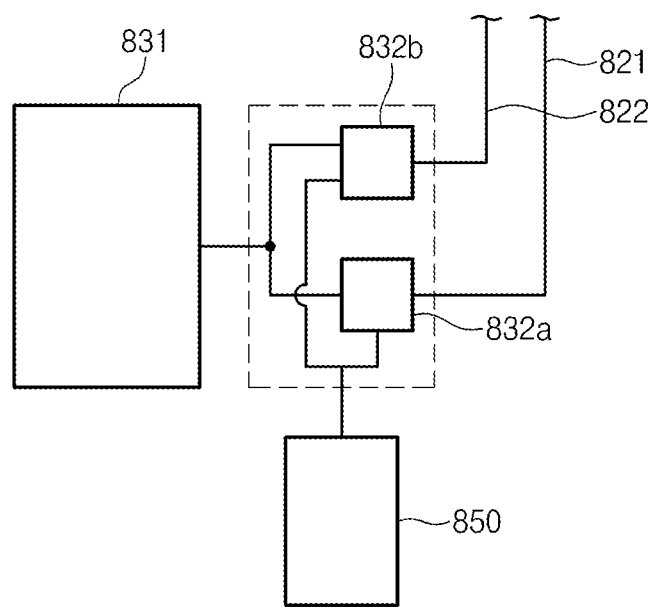
FIG. 4 is a view illustrating a specific configuration of a pipe control module.

FIG. 4 is a view illustrating a specific configuration of a pipe control module.

Referring to FIGS. 2 to 4, when it is determined that the pipe control module 832 needs to be adjusted, the module control part 831 performs an adjustment on the pipe control module 832.

The pipe control module 832 includes a first pipe control member 832a and a second pipe control member 832b.

The first pipe control member 832a is connected to each of the first pipe 821 and the fluid supply source 850. The first pipe control member 860 adjusts the fluid supplied from the fluid supply source 850 to an upper space of the cylinder 811 through the first pipe 821. Additionally, the first pipe control member 832*a* may adjust the fluid discharged from an upper space of the cylinder 811 to the outside through the first pipe 821. The first pipe control member 832*a* may be configured including a piezo actuator. The piezo actuator provides a fast response to a signal of the module control part 831, so that it is possible to improve the drivability of the drive member 810.

The second pipe control member 832*b* is connected to each of the second pipe 822 and the fluid supply source 850. The second pipe control member 832*b* adjusts the fluid supplied from the fluid supply source 850 to a lower space of the cylinder 811 through the second pipe 822. Additionally, the second pipe control member 832*b* may adjust the fluid discharged from a lower space of the cylinder 811 to the outside through the second pipe 822. The second pipe control member 832*b* may be configured including a piezo actuator. The piezo actuator provides a fast response to a signal of the module control part 831, so that it is possible to improve the drivability of the drive member 810.

The module control part 831 is connected to the first pipe control member 832*a* and the second pipe control member 832*b* to control operations thereof.

Figure 5:
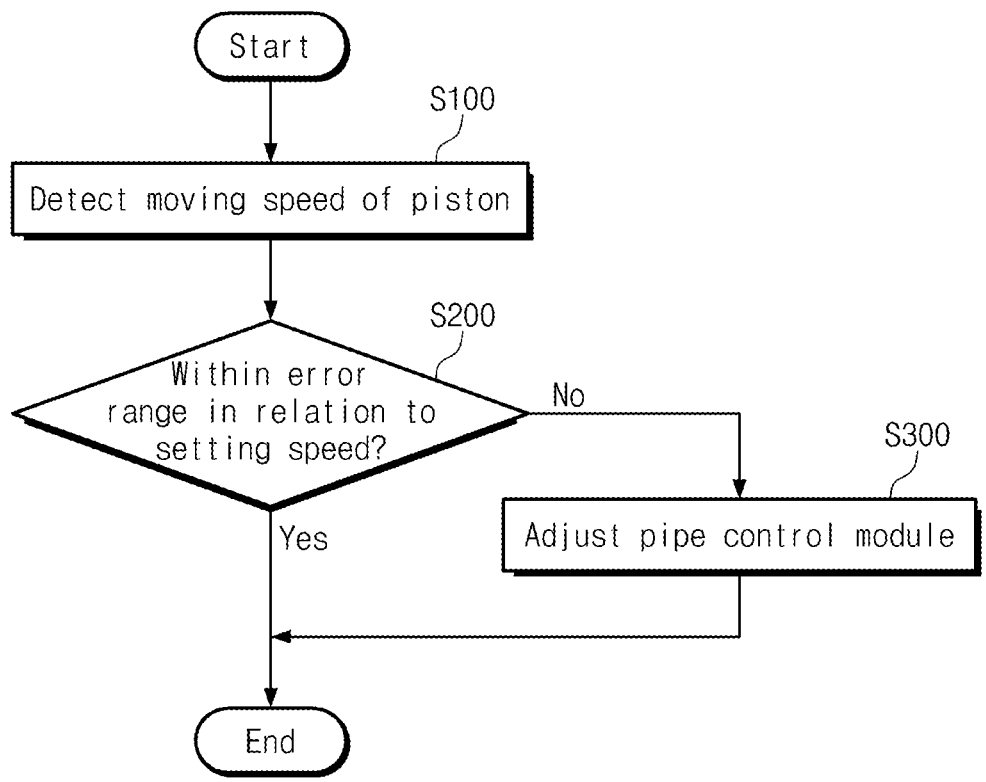
FIG. 5 is a flowchart illustrating an operation of a pipe control unit.
Figure 6:
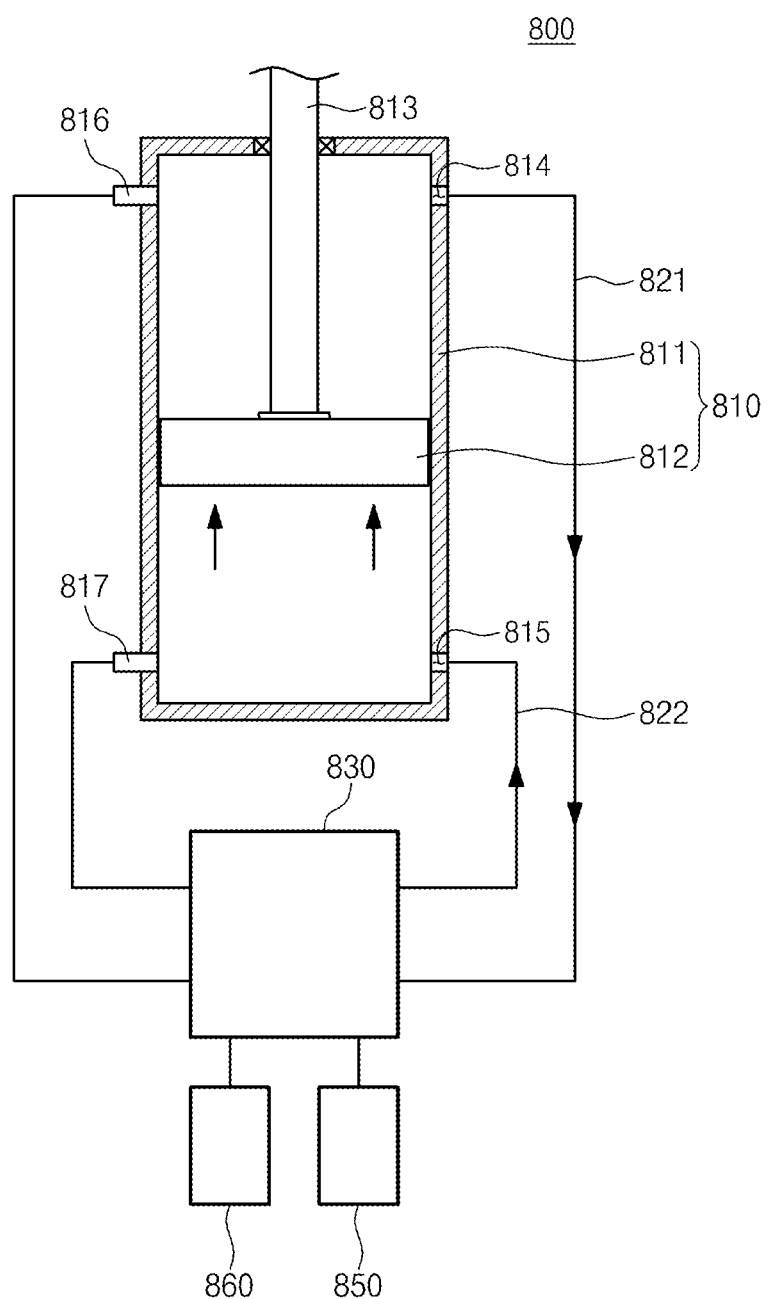
FIG. 6 is a view when a piston moves from a lower portion of a cylinder to an upper portion thereof.

FIG. 5 is a flowchart illustrating an operation of a pipe control unit. FIG. 6 is a view when a piston moves from a lower portion of a cylinder to an upper portion thereof.

Referring to FIGS. 2 to 6, a process that after the piston 812 moves from a lower portion of the cylinder 811 to an upper portion thereof, the pipe control unit 830 adjusts the speed of the piston 812 is described.

When the piston 812 moves from a lower portion of the cylinder 811 to an upper portion thereof, the fluid of the first pipe 821 flows from the cylinder 811 to the first pipe control member 832*a* and the fluid of the second pipe 822 flows from the second pipe control member 832*b* to the cylinder 811. In more detail, the pipe control unit 830 controls the first pipe control member 832*a* to allow the fluid at an upper portion of the cylinder 811 to flow into the first pipe 821 and then be discharged into the outside. Then, the pipe control unit 830 controls the second pipe control member 832*b* to allow the fluid of the fluid supply source 850 to be supplied to a lower portion of the cylinder 811 through the second pipe 822. At this point, the pipe control unit 830 controls an operation of the first pipe control member 832*a* or the second pipe control member 832*b* through a factor value.

For example, a factor value may be the flow rate of a fluid flowing through the pipes 821 and 822. That is, when the amount of a fluid flowing through the pipes 821 and 822 is increased, the moving speed of the piston 812 may be increased. Accordingly, the pipe control unit 830 may control the first pipe control member 832*a* to allow the flow rate of a fluid discharged through the first pipe 821 to be a factor discharge amount. Additionally, the pipe control unit 830 may control the second pipe control member 832*b* to allow the flow rate of a fluid flowing through the second pipe 822 to be a factor inflow amount. Additionally, the pipe control unit 830 may adjust the above factor discharge amount and factor inflow amount together.

Additionally, a factor value may be the pressure of a fluid that flows through a pipe. The speed of the piston 812 may vary according to the pressure of a fluid. As one factor of the above, the above is caused due to a friction force acting between the piston 812 and the cylinder 811, which acts greater when the piston 812 starts to move compared to while the piston 812 moves. As another factor, the above is caused due to a density change of a fluid changing according to the pressures of the fluid. Accordingly, the pipe control unit 830 may adjust the first pipe control member 832*a* to allow the pressure of a fluid discharged through the first pipe 821 to be a factor discharge pressure. Additionally, the pipe control unit 830 may adjust the second pipe control member 832*b* to allow the pressure of a fluid flowing through the second pipe 822 to be a factor inflow pressure. Additionally, the pipe control unit 830 may adjust the above factor discharge pressure and factor inflow pressure together.

The moving speed of the piston 812 may vary with respect to the same factor value. For example, the moving speed of the piston 812 may vary according to a configuration of the substrate treating apparatus 1 connected to the drive shaft 813. Additionally, the moving speed of the piston 812 may change during a process of using the substrate treating apparatus 1. That is, the moving speed of the piston 812 may change due to a change of a frictional force between the piston 812 and the cylinder 811 and a load connected to the drive shaft 813 as the substrate treating apparatus 1 is used.

When the movement of the piston 812 is completed, the pipe control unit 830 detects the transfer speed of the piston 812 in operation S100. In more detail, as the piston 812 moves, a signal that the second sensor 817 and the first sensor 816 transmit to the module control part 831 changes. The module control part 831 may calculate the moving speed of the piston 2 through a time difference between the signals transmitted from the second sensor 817 and the first sensor 816.

Then, the module control part 831 determines whether to adjust the pipe control module 832 by comparing the moving speed of the piston 812 and the setting speed of the piston 812 provided from the control member 860 in operation S200. The module control part 831 may consider an error range when comparing the moving speed and the setting speed. The error range may be set to a percentile value. For example, when the error range is 1% of the setting speed, that is, the moving speed corresponds to 99% to 101% of the setting speed, the module control part 831 determines that it is unnecessary to adjust the pipe control module 822. Additionally, the error range may be set to a real value. That is, when the moving speed of the piston 812 is greater than a value obtained by adding the real value or less than a value obtained by subtracting the real value, the module control part 831 determines that it is unnecessary to adjust the pipe control module 822.

When it is necessary to adjust the pipe control module 832, the module control part 831 adjusts an operation of the pipe control module 832 by adjusting a factor value in operation S300.

First, when the moving speed of the piston 812 is lower than the setting speed, the module control part 831 increases a factor value. For example, when the factor value is the flow rate of a fluid flowing through a pipe, a factor discharge flow rate may be increased so as to increase the flow rate of a fluid discharged through the first pipe 821. Additionally, a factor inflow flow rate may be increased so as to increase the flow rate of a fluid inflowing through the second pipe 822. Additionally, the factor discharge flow rate and the factor inflow flow rate may be increased together. Then, when the factor value is the pressure of a fluid flowing through a pipe, a factor discharge pressure may be increased so as to increase the pressure of a fluid discharged through the first pipe 821. Additionally, a factor inflow pressure may be increased so as to increase the pressure of a fluid inflowing through the second pipe 822. Additionally, the factor discharge pressure and the factor inflow pressure may be increased together. Then, when the factor value is the flow rate and the pressure of a fluid flowing through a pipe, one of a factor inflow flow rate factor and a factor outflow flow rate and one of a factor inflow pressure and a factor outflow pressure are combined and increased.

On the other hand, when the moving speed of the piston 812 is faster than the setting speed, the module control part 831 reduces a factor value. For example, when the factor value is the flow rate of a fluid flowing through a pipe, a factor discharge flow rate may be decreased so as to decrease the flow rate of a fluid discharged through the first pipe 821. Additionally, a factor inflow flow rate may be decreased so as to decrease the flow rate of a fluid inflowing through the second pipe 822. Additionally, the factor discharge flow rate and the factor inflow flow rate may be decreased together. Then, when the factor value is the pressure of a fluid flowing through a pipe, a factor discharge pressure may be decreased so as to decrease the pressure of a fluid discharged through the first pipe 821. Additionally, a factor inflow pressure may be increased so as to decrease the pressure of a fluid inflowing through the second pipe 822. Additionally, the factor discharge pressure and the factor inflow pressure may be decreased together. Then, when the factor value is the flow rate and the pressure of a fluid flowing through a pipe, one of a factor inflow flow rate factor and a factor outflow flow rate and one of a factor inflow pressure and a factor outflow pressure are combined and decreased.

Figure 7:
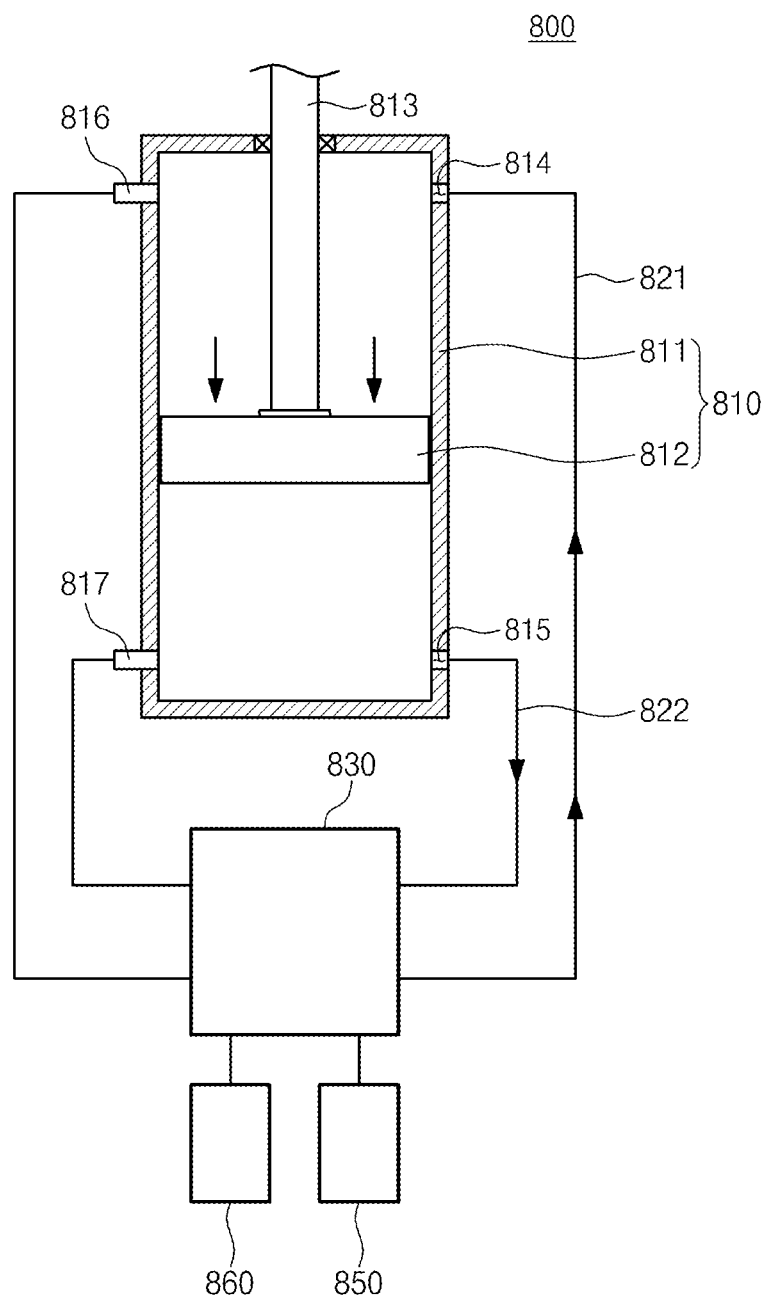
FIG. 7 is a view when a piston moves from an upper portion of a cylinder to a lower portion thereof.

FIG. 7 is a view when a piston moves from an upper portion of a cylinder to a lower portion thereof.

Referring to FIG. 7, when the piston 812 moves from an upper portion of the cylinder 811 to a lower portion thereof, the fluid of the first pipe 821 flows from the first pipe control member 832a to the cylinder 811 and the fluid of the second pipe 822 flows from the cylinder 811 to the second pipe control member 832b. In more detail, the pipe control unit 830 controls the first pipe control member 832a to allow the fluid of the fluid supply source 850 to be supplied to an upper portion of the cylinder 811 through the first pipe 821. Then, the pipe control unit 830 controls the second pipe control member 832b to allow the fluid at a lower portion of the cylinder 811 to flow through the second pipe 822 and then be discharged into the outside. At this point, the pipe control unit 830 controls an operation of the first pipe control member 832a or the second pipe control member 832b through a factor value. The pipe control unit 830 may separately set a first factor value used for a control when the cylinder 811 moves from the bottom to the top and a second factor value used for a control when the cylinder 811 moves from the top to the bottom. Since after the movement of the piston 812 is completed, detecting the moving speed of the piston 812, determining whether it is necessary to adjust the pipe control module 832, and adjusting an operation of the pipe control module 832, by the pipe control unit 830, are similar to when the piston 812 of FIG. 6 moves from the bottom of the cylinder 811 to the top thereof, overlapping descriptions are omitted.

According to an embodiment of the present invention, after the movement of the piston 812 is completed, when the moving speed of the piston 812 is different from the setting speed, the pipe control module 832 is automatically adjusted by using a factor value. Additionally, each time the piston 812 moves several times, the adjustment of the pipe control module 832 is performed, so that the moving speed of the piston 812 becomes the setting speed. Accordingly, according to an embodiment of the present invention after the drive assembly 800 is installed at the substrate treating apparatus 1, a factor value is adjusted automatically. Moreover, a factor value may be adjusted automatically according to a friction coefficient change between the cylinder 811 and the piston 812 and a change in load acting on the drive member 810 while the substrate treating apparatus 1 is used.

According to an embodiment of the present invention, the speed of a piston may be adjusted automatically.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A substrate treating apparatus comprising:
an index robot configured to move linearly along an index rail, the index robot configured to unload a substrate from a carrier and configured to load the substrate to a buffer chamber;
a process chamber configured to perform a treating process to the substrate;
a transfer chamber adjacent to the process chamber and configured to convey the substrate from a buffer chamber to the process chamber;
a main robot configured to move linearly along a guide rail, the main robot configured to unload the substrate from the buffer chamber and configured to load the substrate to the processing chamber; and
a drive assembly configured to supply a power to at least one of the index robot or the main robot,
wherein the drive assembly includes
a cylinder connected to at least one pipe,
a piston disposed to be movable inside the cylinder and connected to the one of the index robot or the main robot by a drive shaft,
a first sensor at a first portion of the cylinder configured to transmit a first signal in response to the piston being in a first position inside the cylinder and to not transmit a signal in response to the piston being in a second position inside the cylinder,
a second sensor at a second portion of the cylinder configured to transmit a second signal in response to the piston being in a third position inside the cylinder and to not transmit a signal in response to the piston being in the second position inside the cylinder, and
a pipe control unit configured to automatically adjust a moving speed of the piston.

2. The substrate treating apparatus of claim 1, wherein the at least one pipe includes:
a first pipe connected to an upper portion of the cylinder; and
a second pipe connected to a lower portion of the cylinder,
wherein the pipe control unit is configured to receive at least one of the first signal and the second signal of the sensors at the cylinder.

3. The substrate treating apparatus of claim 2, wherein the pipe control unit includes:
a pipe control module configured to control a fluid flowing through the at least one pipe; and
a module control part configured to adjust an operation of the pipe control module on the basis of the at least one signal of the sensors.

4. The substrate treating apparatus of claim 3,
the first sensor is at an upper portion of the cylinder; and
the second sensor at a lower portion of the cylinder.

5. The substrate treating apparatus of claim 4, wherein the module control part is configured to detect a moving speed of the piston through a change of the at least one of the first signal and the second signal transmitted from the first sensor and the second sensor.

6. The substrate treating apparatus of claim 5, wherein the module control part is configured to compares the moving speed and a setting speed of the piston and when the moving speed is out of an error range in relation to the setting speed, is configured to perform an adjustment on the pipe control module.

7. The substrate treating apparatus of claim 6, wherein when the moving speed is slower than the setting speed, the module control part is configured to adjust the pipe control module to increase a flow rate of a fluid flowing through the first pipe or the second pipe.

8. The substrate treating apparatus of claim 6, wherein when the moving speed is slower than the setting speed, the module control part is configured to adjust the pipe control module to increase a pressure of a fluid flowing through the first pipe or the second pipe.

9. The substrate treating apparatus of claim 6, wherein when the moving speed is faster than the setting speed, the module control part is configured to adjust the pipe control module to decrease a flow rate of a fluid flowing through the first pipe or the second pipe.

10. The substrate treating apparatus of claim 6, wherein when the moving speed is faster than the setting speed, the module control part is configured to adjust the pipe control module to decrease a pressure of a fluid flowing through the first pipe or the second pipe.

11. The substrate treating apparatus of claim 1, wherein the pipe control unit includes a piezo actuator.

12. A drive assembly comprising:
a cylinder connected to pipes;
a piston configured to be movable inside the cylinder and having one side where a drive shaft is provided;
a first sensor at a first portion of the cylinder configured to transmit a first signal in response to the piston being in a first position inside the cylinder and to not transmit a signal in response to the piston being in a second position inside the cylinder;
a second sensor at a second portion of the cylinder configured to transmit a second signal in response to the piston being in a third position inside the cylinder and to not transmit a signal in response to the piston being in the second position inside the cylinder; and
a pipe control unit configured to automatically adjust a moving speed of the piston by adjusting at least one of a flow rate of a fluid and a pressure of the fluid,
wherein the drive assembly is configured to power at least one of an index robot and a main robot,
the index robot configured to move linearly along an index rail, the index robot configured to unload a substrate from a carrier and configured to load the substrate to a buffer chamber,
the main robot configured to move linearly along a guide rail, the main robot configured to unload the substrate from the buffer chamber and configured to load the substrate to a processing chamber.

13. The drive assembly of claim 12, wherein the pipes include:
a first pipe connected to an upper portion of the cylinder; and
a second pipe connected to a lower portion of the cylinder.

14. The drive assembly of claim 13, wherein the pipe control unit includes:
a pipe control module configured to control a fluid flowing through the pipes; and
a module control part configured to adjust an operation of the pipe control module on the basis of at least one of the first signal and the second signal of the first sensor and the second sensor.

15. The drive assembly of claim 14, wherein the module control part is configured to detect a moving speed of the piston through a change of the first signal transmitted from the first sensor and the second signal transmitted from the second sensor.

16. The drive assembly of claim 15, wherein the module control part is configured to compare the moving speed and a setting speed of the piston and when the moving speed is out of an error range in relation to the setting speed, is configured to perform an adjustment on the pipe control module.

17. A method of controlling a drive member for use in driving an index robot of a substrate processing system, the method comprising:
transmitting a first signal from a first sensor in response to a piston being at a first position in a cylinder at a first time;
not transmitting the first signal or a second signal in response to the piston being at a second position in the cylinder;
transmitting the second signal from a second sensor in response to the piston being at a third position in the cylinder at a second time;
detecting a moving speed of a piston moving inside a cylinder as a difference from the second time to the first time;
when it is determined that the moving speed of the piston is out of an error range in relation to a setting speed, automatically adjusting a flow of a fluid supplied to the cylinder when the piston is driven next time;
moving the index robot linearly along a guide rail in response to the piston moving inside the cylinder;
unloading a substrate from a carrier; and
loading the substrate to a processing chamber.

18. The method of claim 17, wherein increasing an amount of a fluid supplied to the cylinder when the moving speed of the piston is slower than the setting speed.

19. The method of claim 17, wherein increasing a fluid pressure of a fluid supplied to the cylinder when the moving speed of the piston is slower than the setting speed.

20. The method of claim 17, wherein decreasing an amount of a fluid supplied to the cylinder when the moving speed of the piston is faster than the setting speed.

21. The method of claim 17, wherein decreasing a fluid pressure of a fluid supplied to the cylinder when the moving speed of the piston is faster than the setting speed.

* * * * *